United States Patent [19]

Miller

[11] 4,093,998

[45] June 6, 1978

[54] PROGRAMMING MODULE FOR PROGRAMMABLE CONTROLLER USING A MICROPROCESSOR

[75] Inventor: David D. Miller, Davenport, Iowa

[73] Assignee: Gulf & Western Industries, Inc., New York, N.Y.

[21] Appl. No.: 727,785

[22] Filed: Sep. 29, 1976

[51] Int. Cl.² .............................................. G06F 9/00
[52] U.S. Cl. .................................................... 364/900
[58] Field of Search .................. 364/200 MS, 900 MS

[56] References Cited

U.S. PATENT DOCUMENTS

| | | | |
|---|---|---|---|
| 3,798,612 | 3/1974 | Struger et al. | 364/900 |
| 3,944,984 | 3/1976 | Morley et al. | 364/900 |

*Primary Examiner*—Harvey E. Springborn
*Attorney, Agent, or Firm*—Meyer, Tilberry & Body

[57] ABSTRACT

A programming module for programming a number of programmable read only memory (PROM) units secured onto a single memory module for use at a selected location of several locations in a programmable controller using a microprocessor operated on a low order logic voltage level and having output address lines, and input/output bi-directional data lines and having means for creating a read signal in a read line and a write signal in a write line. The programming module comprises an input side with terminals connected with the address lines, the data lines, the read line and the write line and an output side having address terminals, program voltage terminals and data terminals for connection with the single memory module to be programmed. The programming module includes its own high level program voltage power source and decoding means for decoding a memory address and applying a programming voltage to a selected PROM unit in response to an address received by the programming module.

9 Claims, 12 Drawing Figures

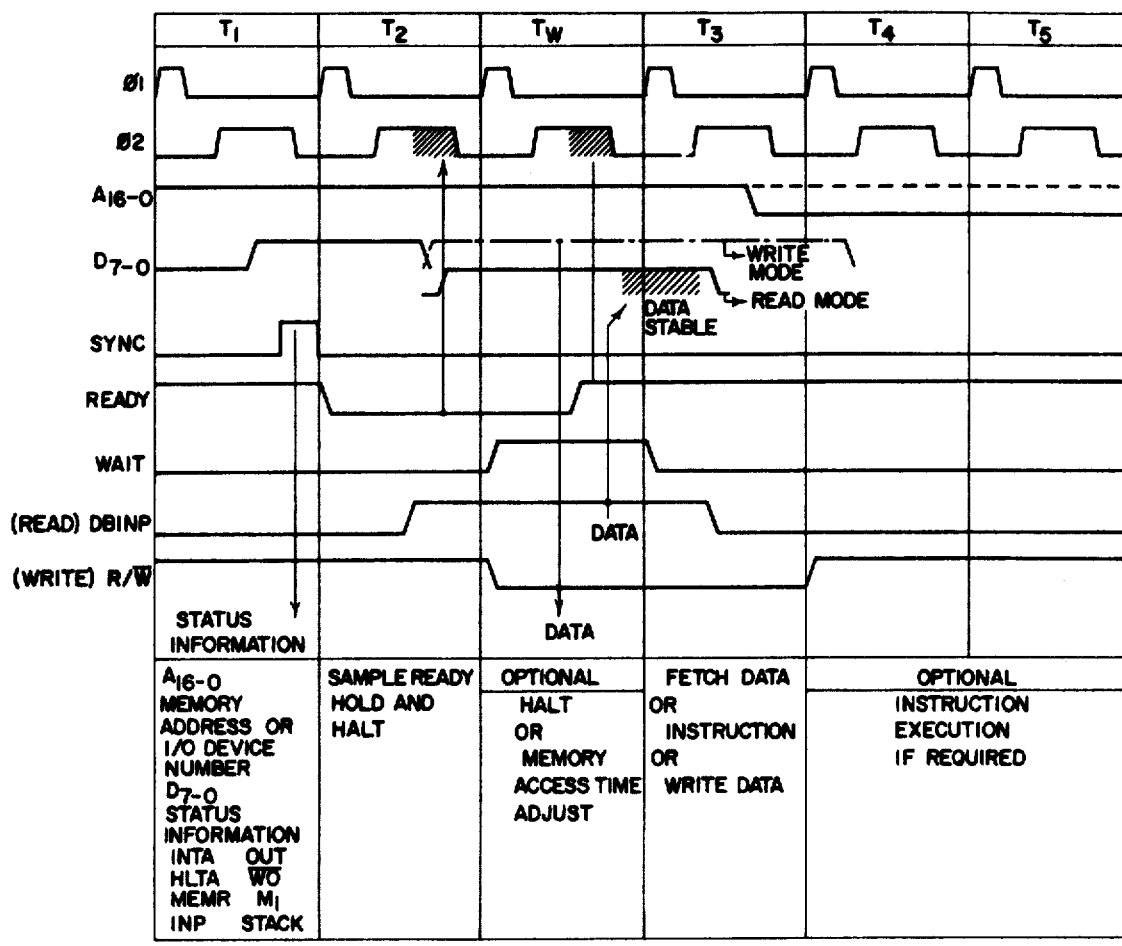

AFTER SELECTION~MEMORY ADDRESS FROM CPU OF EXTERNAL
$A_0$-$A_{11}$ = 1 OF 4096 BYTES OF SELECTED MEMORY MODULE
$A_{12}$-$A_{15}$ = 1 OF 12 MEMORY MODULES

PROGRAMMING MODULE FOR PROGRAMMABLE CONTROLLER USING A MICROPROCESSOR

The present invention relates to the art of programmable controllers using microprocessors and more particularly to a programming module for such a programmable controller using a standard microprocessor.

This invention is particularly applicable as a programming module for a programmable controller to control a machine tool, or other mechanical system of the type generally controlled by input information and output conditions and it will be described with particular reference thereto; however, it should be appreciated that the invention has much broader applications and may be used in various programmable controllers using standard microprocessors as the basic components of the central processor.

INCORPORATION BY REFERENCE

Prior U.S. application Ser. No. 701,858 filed July 1, 1976, is incorporated by reference herein as illustrating a microprocessor for which the programming module of the present invention may be applied. Certain portions of this prior application are herein incorporated specifically as background for disclosing the present invention.

BACKGROUND OF INVENTION

In the last few years, a very advanced data processing device has become commercially available. This device known as a microprocessor, is sold by a variety of companies and generally includes a plurality of address terminals, several bi-directional data terminals and internal control circuitry for processing several types of machine cycles. These microprocessors are produced in accordance with integrated circuit technology of the PMOS and the NMOS type. The versatility of these microprocessors or "microprocessing chips", as they are known, is well known in the art of controlling machine operation. A variety of attempts have been made to utilize the standard microprocessor as the heart of the programmable controller which can control machines and logic systems. However, general attempts to use the microprocessor for a controller function has resulted in complex software requirements. The microprocessor has relatively limited capabilities. Four or six eight bit data bus are generally available and only 16 address lines. In addition, internal processing by the microprocessor is limited so that a substantial number of software steps or program steps must be generated to perform even somewhat simple logic operations. Since a standard microprocessor generally includes four or eight data terminals, it is extremely difficult to process single bit information of the type contemplated in prior U.S. Pat. No. 3,827,030. This patent is also incorporated by reference. Such single bit information requires extensive software for masking of data lines and for shifting data between lines. These and other disadvantages have been overcome by a programmable controller disclosed in the prior U.S. application incorporated by reference herein.

When using a programmable controller utilizing a microprocessor, there is a necessity to load a program into several memory chips or units which are usually of the programmable read only memory (PROM) type. This necessity has caused substantial difficulty in programmable controllers generally and in programmable controllers using microprocessors in specific. Often the memory chips or units are programmed externally of the system and then coupled in selected locations of the system. This requires substantial care to assure proper memory insertion. In addition, the compatibility between a preprogrammed PROM unit and the microprocessor controller may not be positive. This can result in a variety of errors. In addition, the programming of the various program memory units requires a substantially higher voltage than available for operating the logic in the controller itself. Normally the controller employs two voltage sources of 4–5 volts D.C. and 12 volts D.C. Available memory chips or memory units for use in microprocessor controllers usually need a programming voltage of approximately 25–27 volts to assure proper programming. This presents substantial difficulty. A separate power source is generally applied to the memory chip or unit during programming of the chip. This program voltage must be applied to the proper chip simultaneously with the program data being fed into the various memory locations. Often, this requires that each memory chip be disassembled from the system and separately programmed with an external higher program voltage source. After programming, the memory chip must be marked so that its place in the system will be distinguishable. Still, it is possible to apply the chip in the improper position and cause improper operation of the total programmable controller.

Some attempts have been made to program the memory chips on the supporting memory module including several chips. Generally, this requires the disconnection of the chips on the module from the system circuitry and then the application of external information and external programming voltage. Care must be taken to apply the programming voltage to the proper disconnected chip since the data is generally available to all memory chips on a given module. Many of the memory units now used as PROM units are erasable by exposure to ultraviolet light. This is a well known concept. Thus, provisions are made available to apply ultraviolet light to the memory chips for erasure prior to programming. This assures a known initial data state for the various locations. Thereafter, programming can be applied to the chips. This practice again presents some difficulty in programming of the chip of a memory module. Removal of the chip from the memory module for erasing is time consuming and difficult to perform. If the ultraviolet erasing operation is performed while the chips are mounted on the memory module, subsequent programming still involves the difficulty of isolating the chips and applying program or programming voltage to the proper chip.

The present invention relates to a programming module for use in a programmable controller employing a microprocessor, which module can be used as an integral part of the programming system and as an interface between the memory module and the system itself during the actual programming operation. In this manner, programming of the chips on the module is accomplished with the memory module in the proper location in the system. This prevents any inadvertent incompatibility between the programmed memory module and the programmable controller itself. The module is then usable in only the programmed location. Each of the memory modules can be identical. Their location is determined by the location in which they are programmed by the novel programming module. The present invention utilizes a self-addressing concept in the hardwire circuits of the system so that the address of a memory module is the location into which it is inserted. Basically, the present invention relates to an improved programming module for a programmable controller of the type described above.

SUMMARY OF INVENTION

In accordance with one aspect of the present invention, there is provided a method of programming a number of PROM units secured onto a single memory module for use at a selected location of several module locations in a programmable controller using a microprocessor having an output line and input/output bidirectional data lines, said lines being directed to each of said module locations and said units being programmable by directing a program voltage, address code and data to each of said units. The method of the present invention comprises the steps of providing a programming board or module with an input side and an output side and adapted upon actuation to produce the program voltage on one of the several program terminals and to pass signals from the address lines and data lines at the input side to corresponding address terminals and data terminals at the output side; inserting the input side of the programming board into the selected location; connecting the memory module onto the program voltage, addressing and data terminals of the board; actuating the programming board while enabling a selected PROM unit connected to the one program voltage terminal; while the board is actuated, latching data to the data terminals and a memory address at the address terminals; transferring the latched address and latched data to the selected PROM unit; repeating the actuating, latching and transferring steps with different memory addresses; and then disconnecting the module from the programming board and the programming board from the selected location; and, inserting the memory module into the selected location vacated by the programming board or module.

In accordance with another aspect of the invention, the PROM units are erasable upon the exposure to ultraviolet light and the method defined above includes the additional step of exposing the PROM units to an ultraviolet light source before connecting the memory module onto the program voltage, address and data terminals of the programming board or module.

In accordance with another aspect of the present invention there is provided a programming module for programming a number of PROM units secured onto a single memory module for use at a selected location of several locations in a programmable controller using a microprocessor operated on a low order voltage level and having output address lines and input/output bidirectional data lines, the programming module comprises an input side with terminals connected with the address lines and the data lines, an output side having address terminals, program voltage terminals and data terminals for connection with the single memory module, the program voltage terminals each being used to program one of the PROM units; means for decoding at least some of the address lines to produce a program voltage on one of the program voltage terminals; a converter on the programming module for converting the low order voltage level to a substantially higher voltage; means for directing the higher voltage to one of the program voltage terminals; means for creating a programming pulse; and means for energizing the directing means only when the programming pulse is created.

Other aspects of the present invention will be apparent from the description of the preferred embodiment and the appended claims of this application.

The primary object of the present invention is the provision of a method and module for programming the PROM memory units on a memory module in a programmable controller system using a microprocessor, which programming method and module may be used for position programming of the memory units, produce accurate programming and assure accurate, rapid programming.

Another object of the present invention is the provision of a method and module as defined above, which method and module are simple in operation and construction and compatible with microprocessor programmable controllers in general.

Yet another object of the present invention is the provision of a method and module as defined above which employs a module mounted high level program voltage source which prevents inadvertent application to high voltage except during the programming cycle of the memory modules.

BRIEF DESCRIPTION OF THE DRAWINGS

The above objects and advantages will become apparent from the following description taken together with the accompanying drawings in which:

FIG. 2 is a status chart indicating the data line coding at the various status conditions for a machine cycle in a standard microprocessor of the type employed in the system shown in FIG. 1;

FIG. 3 is a pulse chart for the timing functions of the standard 8080 Intel microprocessor of the type employed in the programmable controller system illustrated in FIG. 1;

GENERAL CONTROLLER SYSTEM

Figure 1:
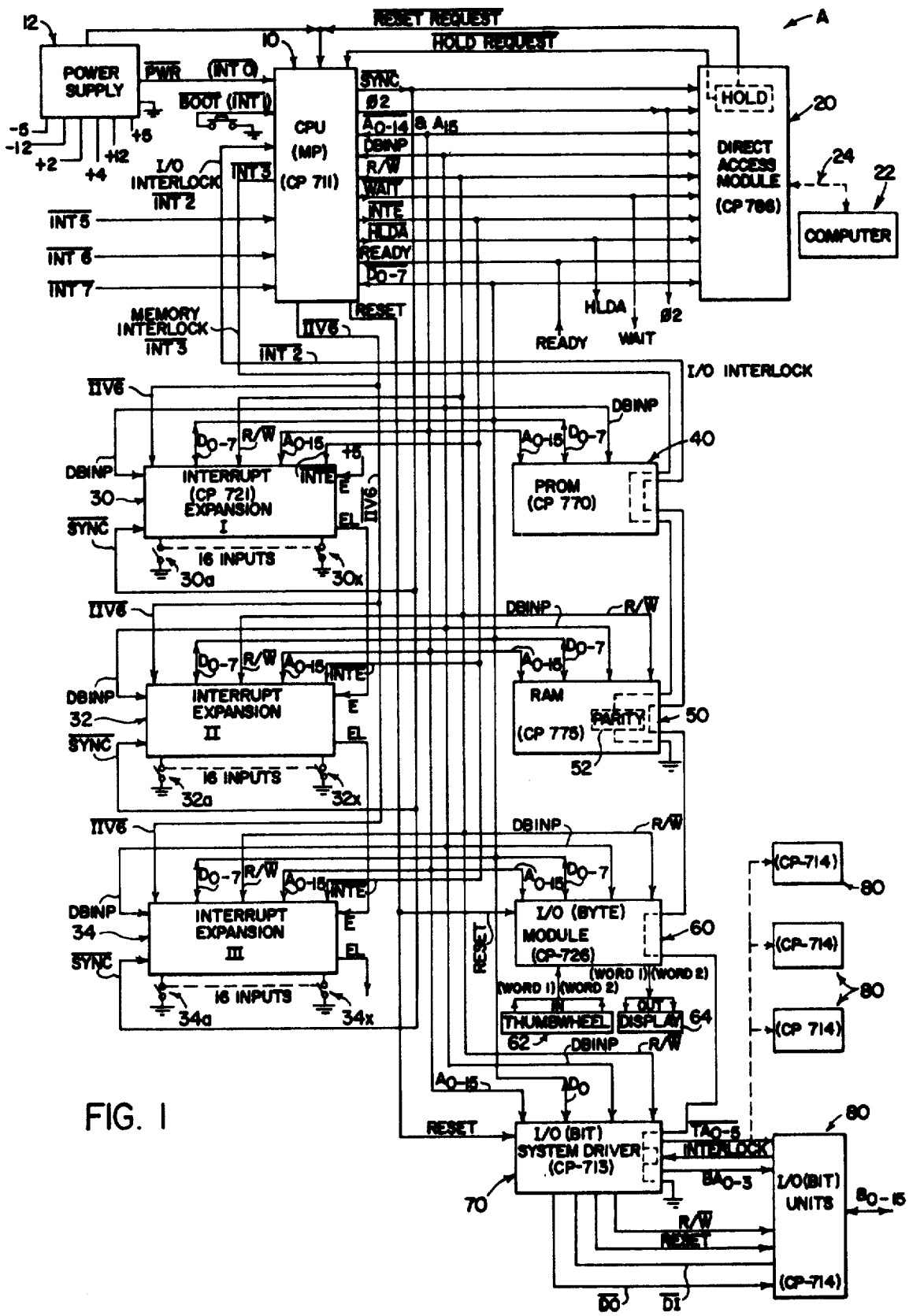
FIG. 1 is a schematic view setting forth a microprocessor programmable controller system in which the present invention is preferably used and schematically illustrating various modules employed in such a controller system.

Referring now to FIGS. 1, 2 and 3 wherein the showings are for the purpose of illustrating a programmable controller A for controlling machines, processes and other systems in response to input information from inputs and existing conditions or other parameters. This controller system uses the module and method of the present invention. The inputs, conditions and parameters are directed to the controller A from various external terminals and locations which are capable of providing binary information as single bit or multiple bits, i.e. bytes. These external terminals may be switches, decoded thumbwheels, lights, decoded analog data and binary coded conditions. In accordance with normal practice the controller includes memory locations and is processed in accordance with a program stored as a plurality of steps or instructions in such system memory. Certain random access memories are provided for storing intermediate information or data. This memory can also be used for some program storage although a program read only memory is generally used for storage of the program information or steps.

As illustrated in FIG. 1, programmable controller A is a digital processing system including a plurality of separate and distinct plug-in modules interconnected by a plurality of control lines, which are generally in a motherboard connecting system, except for remote input/output modules. The basic modules and control lines therefore are schematically illustrated in FIG. 1 wherein a central processing unit module (CPU) 10 or module CP711 employs a standard microprocessor as its central control unit. This microprocessor is a known MOS integrated circuit chip which includes internal registers, counters, pointers and associated logic circuitry well known in the art. The microprocessor, has a number of output address terminals, a number of bi-directional data terminals, means for setting the chip into various known states and means for providing a status code on the data lines at the start of each separate command. Although a variety of microprocessors having these standard capabilities could be used, the embodiment illustrated in FIGS. 1, 2 and 3 involves the use of an Intel 8080 microprocessor which has sixteen address terminals and eight bi-directional data terminals. The controller A incorporates the various concepts relating to the use of a microprocessor for processing input and output information to control a preprogrammed series of events of a machine, process, etc. The input information in the illustrated embodiment is digital information both at the input and output; however, converters for conversion between analog and digital could be used to interface between the system shown in FIG. 1 and various analog inputs and/or outputs. The CPU module 10 is communicated with the other modules to process input and output information on lines $D_0$-$D_7$. A brief description of the separate modules will be sufficient to illustrate their intended use with the CPU module 10 and the overall operation of programmable controller A.

To initially program and debug the controller A, there is provided a direct access module 20 which takes over control of several control lines connected to CPU module 10. Thus, it is possible to directly program the memories in controller or system A by an external device, such as a schematically represented digital computer 22. In the illustrated embodiment, the computer is connected to direct access module 20 by schematically represented lines 24. When a HOLD REQUEST signal is directed from module 20 to CPU module 10, computer 22, or other external control devices, obtains control over the address lines, the input designation line DBINP, the READ/$\overline{\text{WRITE}}$ line, and the $D_0$-$D_7$ data lines, and other lines shown by the arrows in FIG. 1. When this happens, the CPU module is essentially disconnected from the rest of the controller and computer 22 can load memories, i.e. to program the controller, and actually operate the controller, as in debugging and troubleshooting. The direct access module is used to load all memories of system A with the desired logic, set inputs and outputs to the desired conditions, selectively read the contents of the memory or the various input and output circuits, reset controller A, provide intermediate stop and run operations for the controller A, and check the status of all the memory positions and registers of controller A including the registers of the microprocessor MP in CPU module 10. The direct access module is used for flow of data to and from system A under the control of an external unit such as a computer, external tape reading devices, teletype, etc.

In order to accomplish transfer of control to module 20, microprocessor MP of module 10 is placed into the HOLD state, which will be explained later. The external programmer, such as a computer or tape reader, sends data to and from controller A through data lines $D_0$-$D_7$ and the location of the data is controlled by address lines $A_0$-$A_{15}$. By placing the microprocessor of module 10 in the HOLD condition or state, instead of the HALT state, the functions of the microprocessor can be taken over by a programmed signal or request from module 20. Also, control by the microprocessor can be reestablished by a simple command without complex programming required when the microprocessor shifts to a HALT state. It is not necessary to provide an initiation pulse for again obtaining control over system A by module 10. As soon as the HOLD condition is released, the CPU module 10 again assumes control over the lines illustrated in FIG. 1. This provides a convenient manner for giving direct access to the controller A for programming and debugging and then for releasing the controller for control, which is isolated from module 20.

CPU module 10 may be interrupted by external conditions to interrupt the program and shift control over the microprocessor to a memory stored subroutine. This is a standard INTERRUPT feature of most eight bit microprocessors; however, controller A includes a plurality of separate interrupt expansion modules, three of which are schematically illustrated as interrupt expansion modules I, II, III, or 30, 32 and 34, respectively. The difference between the first expansion module and subsequent expansion modules is that the enabled terminal E of module 30 is tied to a logic 1, which in practice is five volts throughout controller or system A. The subsequent modules 32, 34, and any additional modules, include an input enable logic at terminal E which is controlled by the condition of preceding interrupt expansion modules. This connection arrangement provides a priority level system wherein the interrupt inputs of module 30 have a priority over the interrupt inputs of subsequent interconnected expansion modules 32, 34, etc. In each of the interrupt expansion modules, in the illustrated embodiment, there are provided sixteen separate interrupt inputs which are schematically illustrated as a plurality of single pole, grounded switches 30a-30x, 32a-32x and 34a-34x. These interrupt inputs can be logic inputs which contain information requesting a shift of module 10 into the interrupt state for processing of a selected subroutine. Thus, actuation of an input will cause the microprocessor MP of module 10 to interrupt and shift into the subroutine which is to be processed. Then control is returned to the executive program of controller or system A. By using this interrupt expansion arrangement, a great number of selectable subroutines can be provided and called by providing an interrupt request at one of the several schematically represented logic inputs. The executive program of system A requires the processing of a "look" command or sequence for those data or logic inputs and outputs under interrupt control only when an interrupt request is received indicating that a certain terminal or terminals should be scanned and/or updated.

When an interrupt request is received by the CPU module from a terminal of an expansion module, the microprocessor shifts to an interrupt state and data from the expansion module selects or "calls" a given subroutine by an address on lines $D_0$–$D_7$. Then the calling input or output will be processed according to the desired and requested interrupt subroutine. Thereafter the subroutine will shift command back to the main program. If there is no interrupt request, then the executive program is processed repeatedly without processing the interrupt subroutines. Consequently, the subroutines are called and processed only when needed. The number of expansion terminals of modules 30–34 can be increased to larger values. The only practical limitations are the memory capacity which can be expanded to various capacities and the time available for processing interrupt subroutines.

By providing the interrupt expansion modules, the microprocessor of system or controller A can be interrupted a substantially greater number of times than is available on known microprocessors. Thus, the normal microprocessor interrupt concept of priority evaluation and jumping to a subroutine called by a particular interrupt can be used for many separate inputs or conditions. This saves programming time and allows the use of subroutines which may be stored into the memories of system A for only periodic use. The versatility of system A is thereby greatly expanded while still using a readily available, relatively inexpensive microprocessor.

Module 40 is a programmable read only memory (PROM) module. This PROM module is used in system A for the purpose of retaining permanent logic at various addressed locations determined by the logic on lines $A_0$–$A_{15}$. In practice, the executive program and the various subroutines are generally, permanently stored at various addressed locations within PROM module 40. This memory module is used for long term or permanent storage of the program and employs MOS memory chips that are erasable upon exposure to ultraviolet light and are programmable by means, such as computer 22 or a tape reading device through direct access module 20. In practice, the PROM module has a capacity of 4,096 eight bit words. The number of words available in the read only memory module 40 may vary according to the desired capacity of system A. In practice, the memory technology used in module 40 is static silicon gate MOS erasable and electrically reprogrammable read only memory chips.

During normal operation of controller A, data is directed from module 40 on lines $D_0$–$D_7$. The parallel transmission of binary data on these lines provides an eight bit word which is addressed by the logic on lines $A_0$–$A_{15}$. In FIG. 1, it is indicated that the data lines $D_0$–$D_7$ are bi-directional at PROM module 40. This is only for the purposes of loading the memory during the programming and debugging operation through direct access module 20. The memory chips of module 40, in practice, are not erasable under normal circumstances; therefore, continuous application of power to this particular module is not required for the purpose of retaining the stored logic. Of course, a variety of different types of read only memories could be used for storing the program information for system A, as schematically illustrated in FIG. 1.

Referring now more particularly to the random access memory (RAM) module 50, this memory module can be updated periodically during use of system or controller A. Various random access memory modules could be used in system A. The random access memory module 50 includes a somewhat standard parity checking circuit 52 schematically illustrated in FIG. 1. In this manner, information to and from the random access memory chips will be checked for parity in accordance with standard practice to determine an error. In practice, module 50 employs random access solid state memory chips with a capacity of 4,096 eight bit words. In this module, an external battery supply is used for retaining the information or data at the several locations on module 50, until the information or data is changed intentionally by operation of controller A. The semiconductor memory technology used in module 50 is static N-MOS random access technology. The module 50 is addressable for both reading and writing by the logic on lines $A_0$–$A_{15}$, which address selects the desired address of the RAM module and directs the eight bit word from that location in parallel onto data lines $D_0$–$D_7$. The DBINP logic and the R/$\overline{\text{W}}$ logic determines whether or not the data is being inserted or read from module 50. Operation of a random access memory in conjunction with a microprocessor or other type of digital programmable controller is known and various systems could be employed.

In addition to the PROM module 40 and the RAM module 50, it is possible to provide additional memory which may be in the form of PROM and/or RAM. The parity circuit 52, in practice, is of the type which provides a nine bit word and circuitry necessary to generate and check one bit of odd parity for each word. When an eight bit word is written into the memory, parity generator tests the word and generates a nine bit which will be either a logic 1 or a logic 0 such that the resulting nine bit word will always contain an odd number of logic 1 conditions. When a word is read from the memory, parity check circuitry checks to be certain that the word still contains an odd number of logic 1 signals. If the check circuit encounters an even number of logic 1 signals, the processor is interrupted in accordance with standard microprocessor practice. Other parity checking circuits or systems could be employed so that errors in the accessed information can be detected.

Programmable controller A employs a standard microprocessor which has eight data terminals and 16 address terminals. In this manner, an eight bit word or byte can be serviced simultaneously by the microprocessor. This capacity provides distinct advantages with respect to a reading of several inputs and writing into several outputs. However, the logic processing of a single bit in an eight bit word such as ANDing, ORing, or INVERTing, presents substantial difficulty. A substantial amount of software programming is required to logic process a single bit of an eight bit word or byte. This requires memory space and extensive programming. This disadvantage is even more serious in controlling machines and process because a great number of simple logic functions are required. In duplicating a standard relay logic diagram or ladder diagram much of the processing is logic processing of single bit information. Thus, to process this single bit information with an eight bit data capacity drastically increases program storage space and control complexity. For instance, when a single input is to be compared with a single output, the use of eight bit input information is a disadvantage. When memory addresses or binary coded data is being transferred or processed, then the large number of data lines is beneficial. To overcome logic processing disadvantages caused by increasing the capacity of the microprocessor, controller system A provides circuitry for obtaining one bit information which can be logic processed on a preselected data line, such as line $D_0$, in a manner similar to a single bit data processor. Thus, it is a relatively simple process to AND, OR and INVERT logic at various inputs and outputs to provide logic functions which are rendered more complex with the advent of the expanded eight bit microprocessor. To illustrate the use of both the byte and bit modes of operation, there is illustrated a byte input and output module 60 and a bit input and output module 70. Module 60 has a series of input words each of which has eight data bits. These words are created by various inputs, such as thumbwheel network 62. In a like manner, the output words from module 60 are illustrated as display signals in a display unit 64. Thus, module 60 is used to input and output a byte of information as an eight bit word into various input or output locations.

A single bit of information is inputted or outputted from the system driver or module 70 on a single data line $D_0$. Thus, when a bit mode of operation is selected by circuitry, constructed in accordance with the present invention, the logic of line $D_0$ only is processed. The logic on the other bi-directional data lines is ignored. To determine whether or not there is a single bit of information directed to the output units 80 through system driver 70, the system driver is controlled by the logic on the input line DBINP and the READ/WRITE line R/$\overline{\text{W}}$. A power supply 12 provides 5 volts D.C. for operation of the logic in system A and 12 volts D.C. for the operation of certain other components. The 2 volt and 4 volt lines from the power supply 12 are used for retaining the logic of the RAM when power is inadvertently interrupted. These two lines are controlled by rechargeable batteries. Of course, a variety of other power supplies could be provided in accordance with the desired power requirements of programmable controller A.

CONTROL LINE DEFINITIONS

Referring again to FIG. 1, a number of control lines are illustrated as communicating between CPU module 10 and the various other modules comprising the programmable controller system A. These control lines are external of the CPU module; however, in many instances they correspond to or are logically associated with certain communicating terminals on the 8080 Intel microprocessor used in the illustrated embodiment of a programmable controller using the present invention.

To appreciate the general operation of programmable controller system A, the basic function of each of the lines illustrated in FIG. 1 will be described separately. Throughout the specification the inverted form of a line designation indicates that a low logic condition, whether pulse or continuous, is the true or "yes" condition. For instance, the READ/$\overline{\text{WRITE}}$ line labeled R/$\overline{\text{W}}$ indicates that the read condition is a logic 1 and the write condition is a logic 0. This convention is used in most equipment employing microprocessors and similar digitally controlled numerical processing devices.

The synchronizing signal line $\overline{\text{SYNC}}$ consists of a 100ns negative or low logic pulse indicating the beginning of each 8080 machine cycle. This pulse is not programmable and is used to latch the status word in each component or module which requires status information from the CPU for use during a total machine cycle which may contain one or more words.

The external clock pulse $\overline{\text{O}2}$ is created by the CPU internal clocking generator and can be used to synchronize the operation of the various modules. The signal may also be used as an accurate time base. In practice, this clock has either a 2.0 or a 3.0 MHz frequency.

The address lines $A_0$-$A_{15}$ are all logic 0 true, except for $A_{15}$. The logic on these lines is used to provide the address to all memories and I/O modules for controller system A. These address lines are generally output lines from module 10; however, when using the direct access module 20, they are bi-directional and allow input of addresses to module 10. $A_0$ is the least significant address bit in the addressing lines.

The DBINP line indicates the direction of communication of the data lines $D_0$-$D_7$. This control line is used to gate data onto the data bus lines from each of the modules of system A.

The R/$\overline{\text{W}}$ line is used in system A to gate data on the data buses to the addressed locations. In view of the similarity between the DBINP line and the R/$\overline{\text{W}}$ line, they are generally used together. The DBINP line is used to determine the direction of data flow and to gate the data onto the data buses. The READ/$\overline{\text{WRITE}}$ line R/$\overline{\text{W}}$ is used to determine whether this data is written or read. By providing these two control lines, the data on the data bus or lines $D_0$-$D_7$ is stable during the reading and writing pulse on the R/$\overline{\text{W}}$ line.

The $\overline{\text{WAIT}}$ line is used in connection with the READY line. These lines are communicated with the microprocessor, which allows an additional amount of time for reading slower memory or I/O (input/output) locations. If during an addressed output, the module 10 does not receive a logic 1 condition on the READY line, the microprocessor will enter a WAIT state as long as the READY line is at a low logic. In this state, a logic 0 is created on the $\overline{\text{WAIT}}$ line. As soon as the READY input is received, the microprocessor passes out of the WAIT state and a logic 1 appears on the $\overline{\text{WAIT}}$ line. This feature is clearly illustrated in FIG. 2 which relates to the operation of the 8080 Intel microprocessor.

The $\overline{\text{INTE}}$ output indicates the content of an internal interrupt enable flip-flop on the 8080 microprocessor chip. This internal flip-flop may be set or reset by enable and disable interrupt instructions and inhibits subsequent interrupt calls from being accepted by the microprocessor when the flip-flop is in the reset condition. The internal flip-flop which is produced on the chip itself is automatically reset to disable further interrupts at the time $T_1$ of an Instruction Fetch cycle $M_1$ and when an interrupt has been accepted by the microprocessor.

The $\overline{\text{HLDA}}$ line is the HOLD Acknowledge line. This line shifts to a logic 0 when a HOLD REQUEST is acknowledged by the microprocessor MP. This HOLD REQUEST is from the line HOLD REQUEST, as shown in FIG. 1. The HOLD condition or stage of the microprocessor shifts the address and data terminals of the microprocessor to a high impedance state so that these terminals release control over the address lines $A_0$-$A_{15}$ and the data lines $D_0$-$D_7$. These lines can be controlled by the access module 20 during programming and debugging. The signal on the $\overline{\text{HLDA}}$ line begins at time $T_3$ for a read memory or input cycle. For a write in memory or an output cycle or operation, the $\overline{\text{HLDA}}$ line is shifted at the clock period following the $T_3$ clocking period. In practice, it is known that the signal on the $\overline{\text{HLDA}}$ line appears after a rising edge of 01 of the high impedance on the address lines and data lines occurs after the following edge of 02. The HOLD REQUEST line indicates that there has been an external request to shift the CPU, and more particularly the microprocessing chip, into the HOLD condition or state. In this HOLD condition or state, external devices can control the address and data lines as soon as the CPU module has completed its use of these lines for processing the existing or current machine cycle. Control is also relinquished by the CPU module over the DBINP line and the R/$\overline{\text{W}}$ line. In other words, these lines may be controlled by the direct access module 20 for programming or other external control functions. In summary, when a HOLD state is requested, the microprocessor shifts into the HOLD condition or state and gives an output signal on the $\overline{\text{HLDA}}$ line to indicate this HOLD condition. This condition occurs after a certain amount of clean-up during a machine cycle being processed. The HOLD condition or state comes into being at the next machine cycle and holds the existing internal logic on register conditions of the microprocessor chip.

A similar arrangement is used for the reset operation. A Reset Request is created by the power supply 12 or by the direct access module 20 on the RESET REQUEST line. When this request is received by module 10, the microprocessor is reset. In this condition, the content of the internal program counter of the 8080 microprocessor is cleared. After the reset pulse, the program will start at a location word zero in the memory. The internal INTE and HLDA flip-flops of the microprocessor chip are also reset. The internal accumulator, stack pointer, and registers are not cleared. When the reset condition is entered, the logic on the RESET line is shifted to reset the various flip-flops and other logics throughout system A. This arrangement is used for starting controller system A into operation.

The bi-directional data buses or lines $\overline{D_0}$-$\overline{D_7}$ provide eight bit data communication to and from CPU module 10. In addition, these lines are communicated with the various memory modules and I/O modules. The modules which perform only bit functions, as opposed to byte functions, utilize only one of these lines, at least for outputting data. In the preferred embodiment, this line is $D_0$. During the first clock cycle of each machine cycle of the microprocessor, the CPU module outputs a status word on the data line or bus $D_0$-$D_7$. This status word is an eight bit word which describes the current machine cycle. In this status word, the $D_0$ line, in the preferred embodiment, is the least significant bit. The present invention relates to a microprocessor of the type utilizing eight bits of data; however, a different number of data bits can be employed without departing from the intended scope of the invention. With an eight data bit microprocessor the status word can have eight bits generated by the microprocessor according to the instruction or command received from the program.

In microprocessors now available, there is an INTERRUPT capability which is briefly described above. An INTERRUPT capability of the microprocessor allows it to store its present position in a program, jump to a called subroutine, process the subroutine and then jump back to the proper location in the program that was being previously processed. To perform this function, the microprocessor has an INT input and module 10 has several interrupt request terminals INT 0–INT 7. Logic on the INT terminal shifts the microprocessor into the interrupt state. At that time, the INTE terminal (INTE line) is energized to prevent subsequent interrupts, until the selected subroutine has reset the INTE terminal at the proper time. A higher priority interrupt can take over operation of the controller before a lower level priority interrupt subroutine is completed, if the INTE has been reset by the processed subroutine. In the past, processing systems utilizing the microprocessor have involved the capability of receiving only a finite, relatively limited number of interrupt requests. This limitation has been dictated by the limitations of the various codes available for subroutine selection or "call". System A employs a system which includes eight interrupt inputs which will shift the microprocessor into the interrupt state. In FIG. 1, interrupts INT 0–INT 3 and INT 5–INT 7 are illustrated. In practice, these interrupts are assigned to external conditions, terminals or parameters, which may be inputs or outputs. The priority of the interrupt requests is in reverse order to the numbering, with the highest priority having the lowest number. The lowest priority has the highest number; therefore, the $\overline{\text{PWR}}$ condition, which is a logic 0 when power has been turned off, is the highest priority interrupt. In this condition, irrespective of other interrupt conditions, the program will shift into the "power off" subroutine which is found at a selected position in memory, which in practice is octal 010. In practice, the next interrupt input is the $\overline{\text{BOOT}}$ which creates interrupt request INT 2 to a location in memory. In this manner, a minimum program is available for initial operation of system A. This initial minimum program is located at octal 020 of memory and is "called" by various means schematically represented as a push-button in FIG. 1. Interrupt request INT 3 is the module interlock and parity check condition, which is operated in accordance with known practice to maintain continuity of the various modules. The INT 4 interrupt request is a real clock interrupt request, which shifts the program to the octal 040 position in memory. This will be described in more detail with respect to the interrupt functions of system A. INT 5 is a communication interrupt, in the preferred embodiment of the invention. This interrupt generates a location octal 050 in memory. This allows communication from external means, such as the direct access module 20. The interrupt INT 7, which has the lowest priority, places the microprocessor into the interrupt state to read or write from external devices, such as thumbwheels, lights, switches and visual display devices. This leaves INT 6, which is used with modules 30, 32 and 35 to expand the amount of interrupt capability in system A. The IIV6 output acknowledges the receipt and processing of an INT 6 interrupt request. This signal line remains at a low logic while the interrupting device transmits a call from one of the modules 30-34 to the CPU module 10. The call instruction is transmitted synchronously with a 02 clock signal and provides the address in memory to which a call is placed during a selected additional interrupt provided by the add-on modules, only three of which are shown.

This description of the basic lines or command paths directed to and from CPU module 10 will be sufficient for a full appreciation of the invention which contemplates an improved module used with a microprocessor programmable controller of the type schematically shown in FIG. 1. These outputs and input lines correspond in nomenclature used by Intel Corporation for its 8080 microprocessor chip used in the preferred embodiment of the present invention. Corresponding nomenclature is used in other commercially available microprocessor chips which have the characteristics set forth generally herein as background and explanatory information well known in the field. The characteristics of this microprocessor chip are well known. Module 10 could produce an I-STROBE control line for software production of a strobe to the various inputs and outputs, if desired.

STATUS WORD FOR MICROPROCESSOR

In the microprocessor utilized in module 10, as in most microprocessors, a status word appears on the data terminals at the first of each machine cycle. This status word indicates the operation to be performed by the microprocessor during the current machine cycle. Although a variety of status codes and conditions could be provided, the ten status words of the Intel 8080 microprocessor are illustrated in the chart shown in FIG. 2. The data terminals have the coding indicated in the vertical columns for each of the various types of machine cycles during the initial part of the cycle. The binary status code on terminals $D_0$-$D_7$ is latched into a status latch at the initial synchronization pulse in the $\overline{SYNC}$ line.

When the machine cycle is an INTERSECTION FETCH, the coding on data lines $D_0$-$D_7$ as latched into the status latch will be 01000101. The binary code on each of the data terminals during the initial part of the cycle indicates a condition, as set forth in the status information column. In accordance with Intel 8080 terminology, the logic of data bus $D_0$ is the interrupt acknowledge (INTA). This logic indicates whether an interrupt request has been acknowledged and can be used to gate a restart instruction onto the data buses when the DBIN or DBINP line is active. The logic on the $D_1$ line during the initial part of the machine cycle indicates whether or not there is a writing function. This status is labeled $\overline{W}$ and is a logic 0 when the machine cycle will write data into memory or into an output location. When a logic 1 appears on the $D_1$ instruction line and is latched at the status latch, a memory or input location is read. A logic 1 on the $D_2$ line during the instruction read portion of the cycle indicates that the address buses $A_0$-$A_{15}$ hold the push down stack address from the stack pointer of the microprocessor. This status labeled STACK, is active during only a STACK READ or a STACK WRITE machine cycle.

When a logic 1 appears upon the $D_3$ data line during the initial micro cycle of a machine cycle, this indicates that HALT has been acknowledged. As can be seen in FIG. 2, this occurs during a Halt Acknowledge machine cycle or an Interrupt Acknowledge While Halt machine cycle. Otherwise, during the initial micro cycle, which is labeled $T_1$ in FIG. 3, this data bus $D_3$ is a logic 0. During an output function, the logic on line $D_4$ is a logic 1. This occurs when the machine cycle is an Output Write cycle. A logic 1 on the $D_4$ data line indicates that the address buses contain the address of an output device and that the data bus will ultimately, during the cycle, contain the output data when the R/$\overline{W}$ line is at a logic 0. The logic on data line $D_5$ provides a signel to indicate that the microprocessor is in the FETCH cycle for the first byte of an instruction. Thus, a logic 1 on $D_5$ during the initial portion of the machine cycle indicates that an instruction is to be obtained from memory or another location. This is the status $M_1$ illustrated in FIG. 2. The status INP is contained upon data line $D_6$. A logic 1 on this line during the status portion of a machine cycle indicates that the address buses contain the address of an input device and the input data should be placed upon the data buses when the DBIN output of the microprocessor is active. This output of course corresponds to the DBINP line of the CPU module 10. MEMR logic appears upon the $D_7$ data bus. A logic 1 on this bus during the status information portion of the cycle designates that the data buses will be used for a memory read operation.

During the status portion of any cycle, the coding upon data lines $D_0$-$D_7$ are the codes indicated in FIG. 2. This coding is an inherent function of the 8080 microprocessor and is set forth only for the purpose of a more convenient arrangement for understanding the preferred embodiment of the present invention.

BASIC INSTRUCTION CYCLE FOR CPU MODULE

The microprocessor employed in the preferred embodiment of the present invention has a basic instruction cycle as illustrated in FIG. 3. The microprocessor is timed by the input pulses 01, 02, the first of which determines the initial portion of a micro cycle labeled $T_1$-$T_5$. The micro cycle $T_W$ is set forth for the purpose of designating a wait condition which was described earlier with respect to the interplay between the READY logic and the WAIT logic. If a memory is not ready, then the microprocessor goes into a WAIT state represented by a logic 1 on the WAIT line, i.e. a logic 0 on the $\overline{WAIT}$ line. When the memory is then ready, the WAIT line shifts back to a logic 0 and the microprocessor continues into micro cycle $T_3$. For each machine cycle there is a synchronizing pulse labeled SYNC. This synchronization pulse corresponds essentially to the internal synchronizing pulse of the 8080 microprocessor. The pulse has been shaped somewhat. The pulses shown in FIG. 3 are those entering and leaving the module 10; however, they are basically the pulses from the microprocessor itself. During each of the micro cycles, the function set forth at the lower portion of FIG. 3 takes place. Sometime three micro cycles are used. In other instances, many micro cycles are required for a particular instruction. For instance, in an Intel 8080 when memory is accessed, as many as eighteen micro cycles may be used in normal operation. During the $T_1$ micro cycle of a machine cycle, the logic on lines $D_0$-$D_7$ is read. The address on lines $A_0$-$A_{15}$ (at the address terminals of microprocessor MP) is provided by either the internal program counter or another register within the microprocessor. This address information is placed into the program counter or register during a prior machine cycle. The DBINP line corresponds to the internal DBIN line. This determines whether or not data is placed on the data lines $D_0$-$D_7$, in a subsequent portion or micro cycle of the machine cycle. During the initial portion, the data at the data terminals of the microprocessor indicates the type of cycle to be processed during the machine cycle which may require several micro cycles. The logic on the lines designated in FIG. 3 changes according to the type of instruction to be processed in accordance with well known practice in the microprocessing art. These logic conditions will be employed throughout the description of the preferred embodiment of the present invention.

PREFERRED EMBODIMENT

Figure 4:
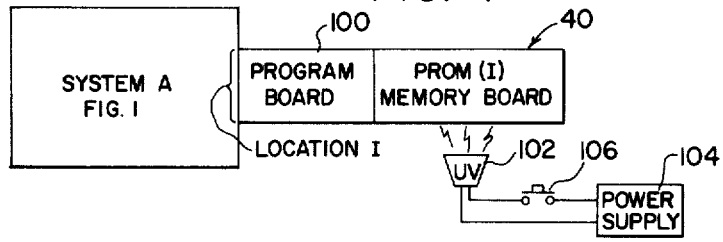
FIG. 4 is a schematic block diagram illustrating an operating step of the preferred embodiment of the present invention.
Figure 5:
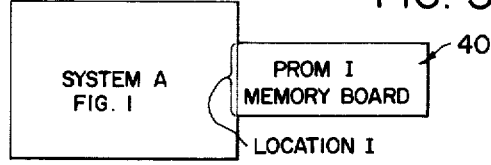
FIG. 5 is a view similar to FIG. 4 showing still a further operating step of the preferred embodiment.
Figure 10:
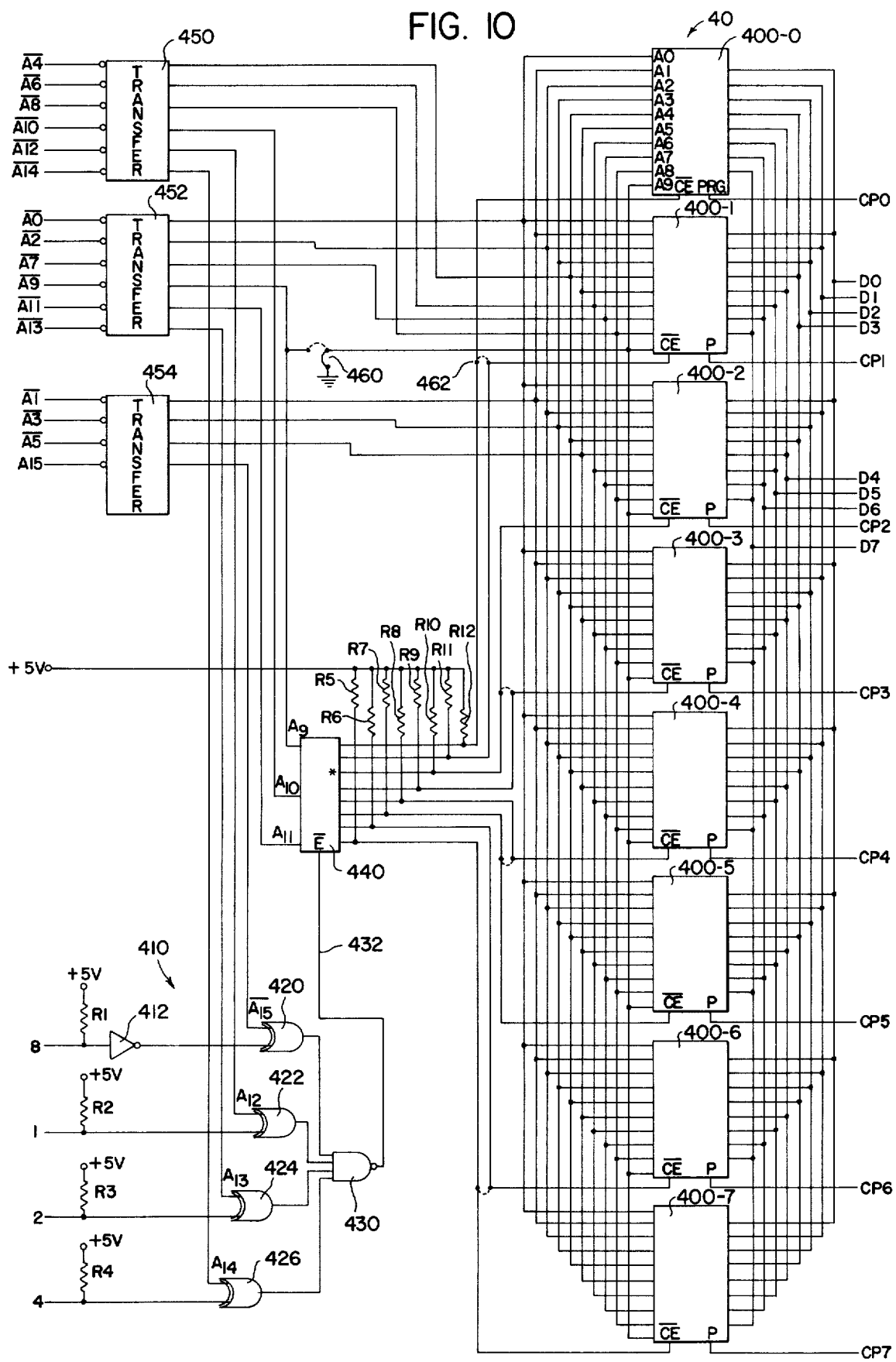

The present invention relates to a programming module 100 shown in FIGS. 4 and 5 and in FIG. 8 which programming module is used to program one of several PROM modules 40 to be located at several known locations in system A shown in FIG. 1. In this system, there are several locations for PROMs, each of which includes a hardwired decoding arrangement between a module 40 and the interconnected chassis motherboard. The hardwired decoding concept will be described later with a disclosure of the manner by which it identifies one of the several memory locations in the chassis supporting system A. In accordance with the showings of FIG. 4, one PROM memory board 40, shown in more detail in FIG. 10, is the memory module selected for use at location I in the chassis of system A. At other locations, different PROM memory modules will be used. These modules are identical to the illustrated module 40 and the number is determined by the needed read only capacity of system A. Also, some PROM modules could include certain RAM memory chips or units for temporary storage of intermediate data.

Figure 7:
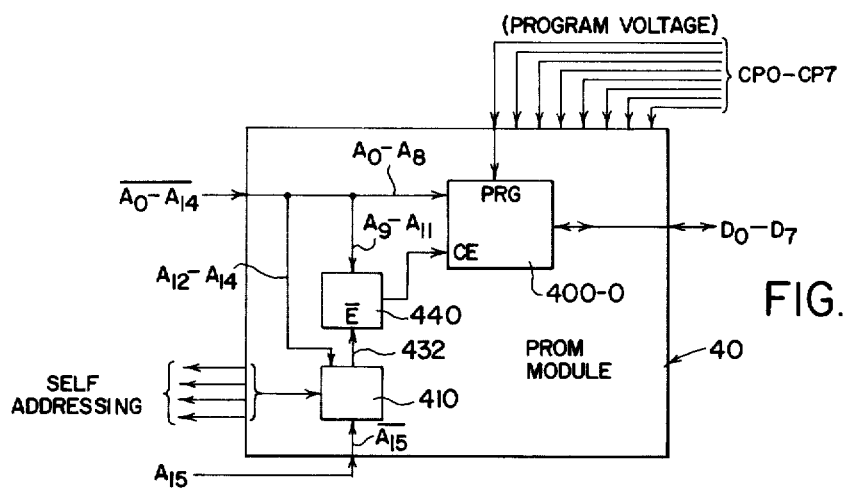
FIG. 7 is a schematic block diagram illustrating the input terminals applied to a single PROM memory module of the system shown in FIG. 1 when the memory module is connected for programming with the programming module of the preferred embodiment of the present invention.

In accordance with the present invention, programming module or board 100 is used for programming the various PROM units or chips on module 40 by the schematically illustrated steps represented by FIGS. 4 and 5. Programming board 100 includes an input side at the left and an output side at the right. The board is inserted into the memory location I by a connection network corresponding to the connection network used for memory board of module 40 during operation of system A. Thereafter, the memory board or module schematically illustrated in FIG. 7 and shown in detail in FIG. 10 is plugged into the output side of programming board 100 which also has a matching connection network that corresponds in structure to the terminals and plug network at location I in the chassis of system A. Thus, memory board 40 is plugged into programming board of module 100 which, in turn, is plugged into the chassis location I of system A as shown in FIG. 4. This connects the input side of module 100 with the motherboard of system A to direct signals and conditions to be experienced by module 40 to the input side of module 100. Module 100 then directs signals for module 40 in a manner similar to the process which module 40 will ultimately receive signals from system A.

In accordance with the preferred embodiment of the present invention the memory units or chips used for the read only memory components on module 40 are the type which are erasable by ultraviolet. Thus, ultraviolet light 102 having an appropriate power source 104 can be energized by an appropriate control means illustrated as a switch 106. Thus, as shown in FIG. 4, the various chips of memory board 40 may be erased by ultraviolet light 102 prior to being plugged into or connected onto the output side of programming module 100. After the programming module performs the programming function to place permanent data into selected address locations of the PROM chips on module 40, the components shown in FIG. 4 are disassembled. Thereafter, the program memory board or module 40 is inserted into the location I of system A for subsequent operation in accordance with the previously described programmer concepts. In this manner, the memory programming board or module 100 can be used at the various locations in system A to program the several memory boards or modules 40 used in a complete programmable control system A, as illustrated in FIG. 1.

Figure 6:
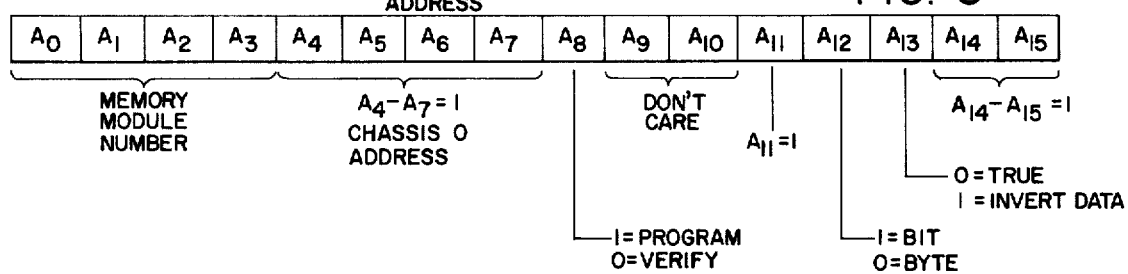
FIG. 6 is a schematic layout illustrating the programming and verification address used in the preferred embodiment of the present invention and the subsequent program memory address employed in the preferred embodiment.

Referring now to FIG. 6, during the programming operation using module 100, the computer 22, as shown in FIG. 1, or any other similar type of programming device, is connected to the direct access module 20 while the CPU is in the Hold or Direct Memory Access Mode. Alternatively the CPU may itself act as the programming device. When the CPU is not in the Hold Mode. This directs programming addresses and data into system A for use by module 40. This information and certain commanded signals from the programming device as used by module 100 are directed to module 100 in the manner shown in FIG. 4. During this process, the dual addressing concept of FIG. 6 is used. At first, the programming device submits an address on lines $A_0$-$A_{15}$. During this first address the programming device issues the command to READ I/O (read the status of module 100) or WRITE I/O (write or set the condition of module 100). The address indicates either that the module 100 is to be placed into the programming mode during a WRITE I/O function, which causes programming of information into the memory units on module 40, or the verify mode during a READ I/O function, which causes reading of information from the memory units on module 40 to be assured that the proper programming operation was performed. After the mode of module 100 has been selected by a programming device command and the first address code, a second address code is directed to module 100 on lines $A_0$-$A_{15}$ from the programming device. This second address includes sixteen bits of information and performs the function determined by the programming device command, i.e. READ MEMORY (read data from addressed memory location) or WRITE MEMORY (write or program data into an addressed memory location). The first twelve bits ($A_0$-$A_{11}$) select the particular byte of the memory units on module 40 being addressed and the last four bits ($A_{12}$-$A_{15}$) indicate the particular address or location of the module being selected. The memory location determines the memory module being addressed or selected during the second address code. Thus, during operation of module 100, a succession of dual addresses with appropriate programming device commands are directed from the programming device, such as the CPU or computer 22 while the CPU is in the Hold or Direct Memory Access mode, or any other similar well known programming arrangements. The first address code includes a logic state on the $A_8$ terminal or address line which indicates the requested write condition of module 100. Address lines $A_0$-$A_3$ selects the particular chassis or module location during the first program address as illustrated in FIG. 6. Address lines $A_4$-$A_7$ are at a logic 1 to indicate that this is a chassis address for I/O instead of a coded external I/O terminal. Address lines $A_{12}$-$A_{15}$ in the first address code do not address a certain chassis location during the first address. Thus, these address lines are used for addressing only in the second coded address. During the second coded address, address lines $A_{12}$-$A_{14}$ and $\overline{A_{15}}$ are used for the addressing of the particular module 100 to be read or written into, as will be described in connection with the operation of the modules shown in FIGS. 8 and 10. In summary, during programming, address lines $A_0$-$A_{15}$ first are provided with a first address code, including a status code on line $A_8$. Thereafter, lines $A_0$-$A_{15}$ are provided with a memory address code.

As shown in FIG. 3, during each of these two cycles or addresses, the commanded function of the programming device provides either a DBINP pulse or a R/$\overline{W}$ pulse. In the former case, this indicates a READ (I/O or MEMORY) function. The latter pulse indicates a WRITE (I/O or MEMORY) function. During the first coded address, a DBINP pulse will allow the condition of module 100 to be read. A R/$\overline{W}$ pulse causes information to be written into module 100. In other words, a R/$\overline{W}$ pulse is used to write into module 100 the status or the selected condition indicated by the logic on line $A_8$. A DBINP pulse, during the first coded address, will allow system A to read the condition or state of module 100. During the second coded address, a DBINP pulse from programming device 10 will allow the module 100 to read the condition of a particular location in a memory chip or module 40 on lines $D_0$-$D_7$. In a similar manner, a R/$\overline{W}$ pulse during the second address will write or program data on lines $D_0$-$D_7$ into an address memory location on module 40. During a READ function, the $D_0$-$D_7$ lines float at the input to the programming device in accordance with known practice. Consequently, these lines can receive data from external sources for reading the same. Thus, the two coded addresses directed in sequence to the module 100 when taken together with the read or write signals of system A will either read or write from module 100 or module 40. This will become apparent from the detailed description of the operation of the preferred embodiment of module 100.

Figure 8A:
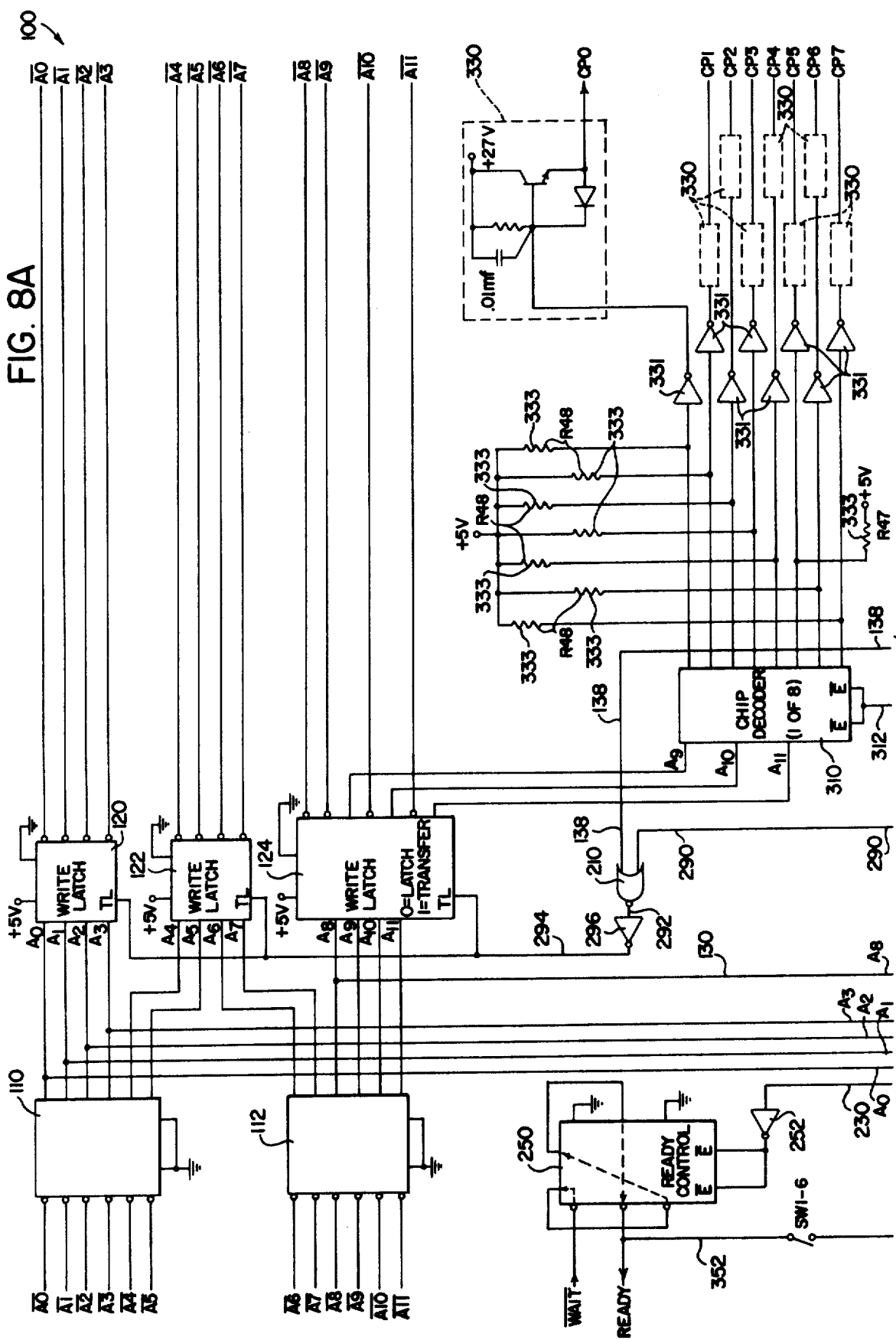
FIG. 8 includes FIGS. 8A, 8B and 8C which are to be taken together to illustrate the preferred embodiment of the present invention.
Figure 8B:
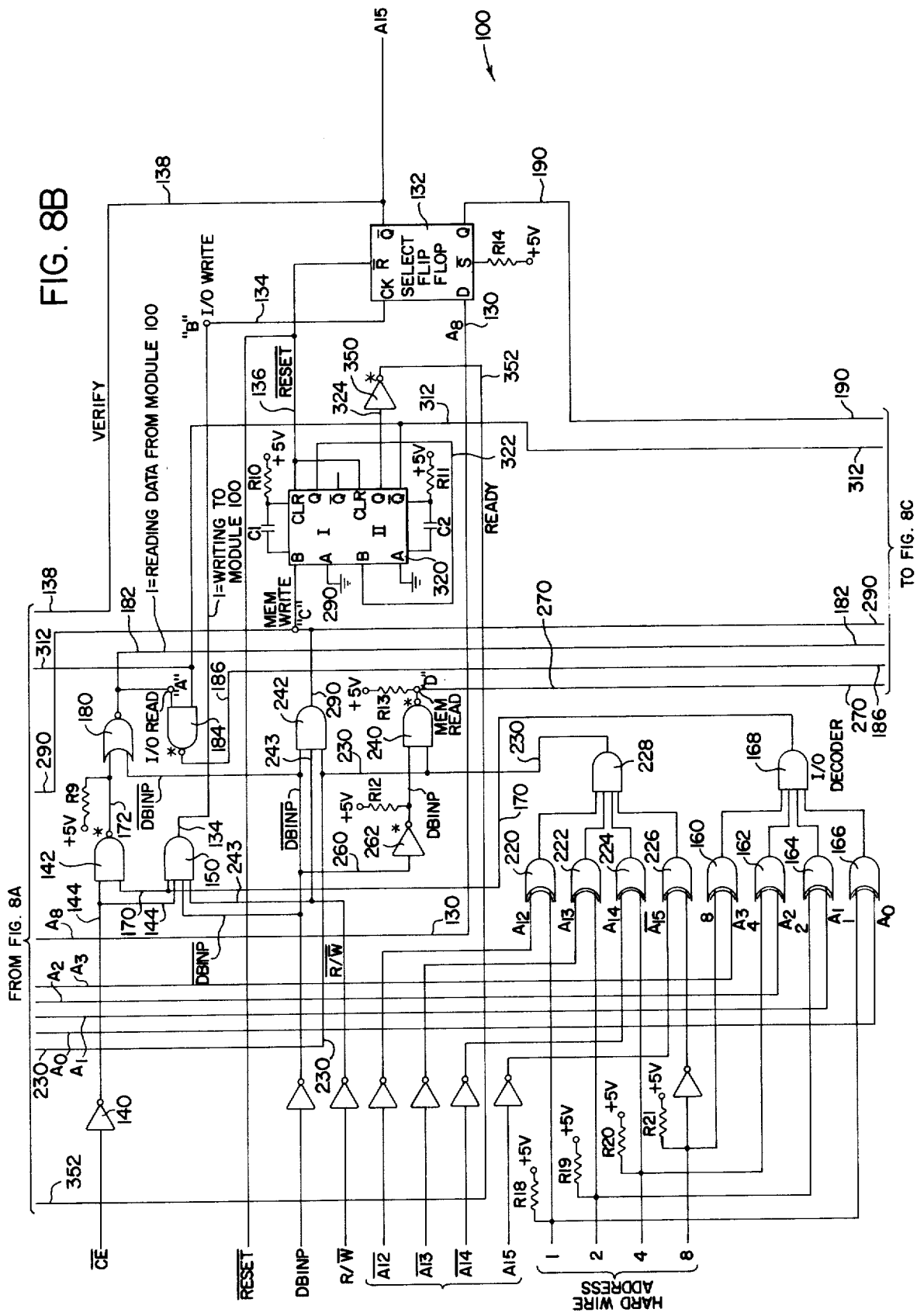
Figures 8C, 9:
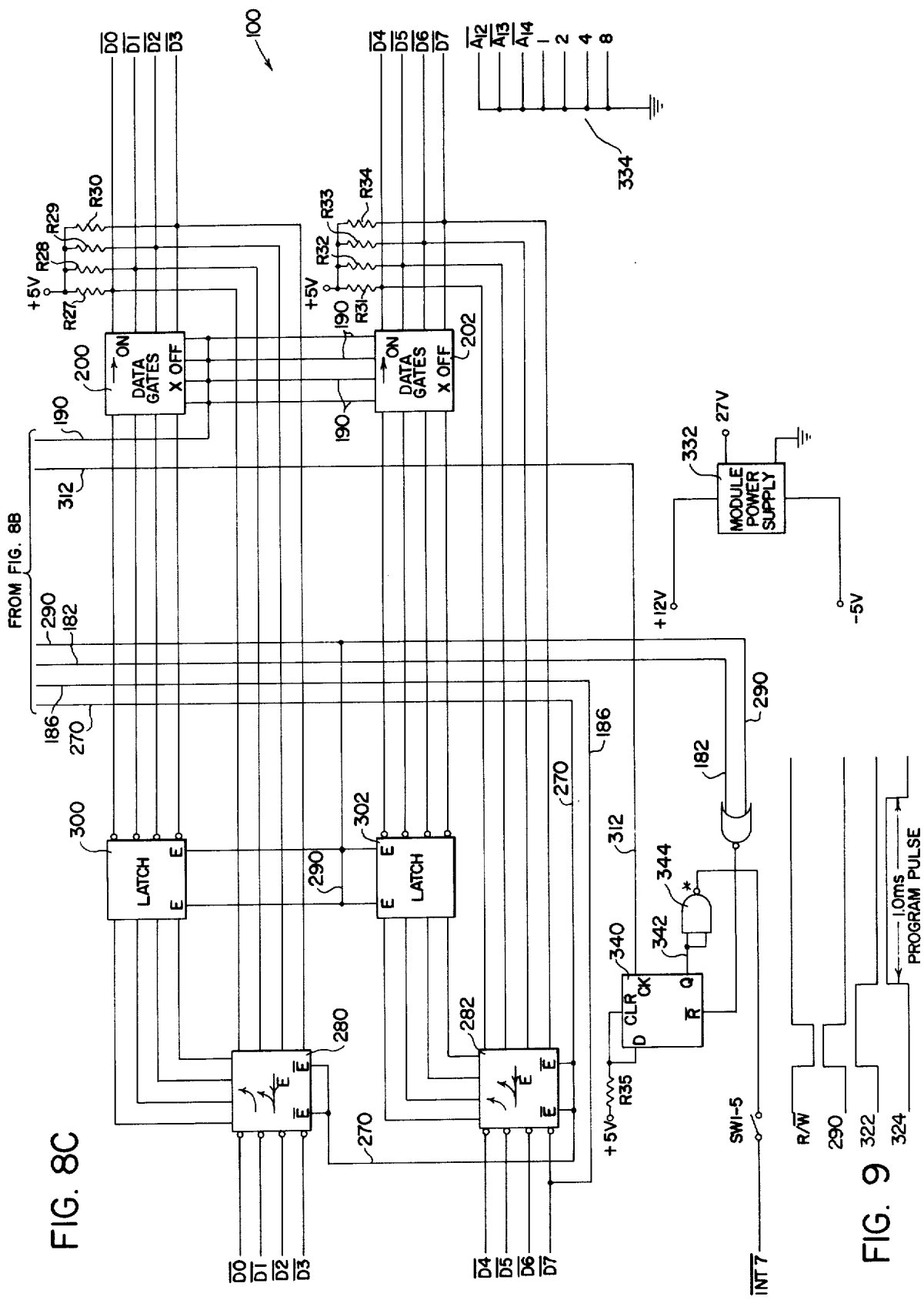
FIG. 9 is a pulse chart illustrating the program initiating pulse and subsequent programming pulse employed in the preferred embodiment of the present invention as shown in FIG. 8; and, FIG. 10 is a PROM memory module to be programmed by the preferred embodiment of the present invention as shown in FIG. 8.

Refering now to FIG. 8, which is composed of FIGS. 8A, 8B and 8C, taken together, the operation of module 100 can best be illustrated by its processing of a memory programming mode selection at a first coded address of FIG. 6 and then the actual programming signals to module 40 at the output side of module 100 during a second address as illustrated in FIG. 6. As previously stated, these addresses come in succession and first set the module 100 and then allow the module 100 to perform the function selected when reading or writing to the memory module.

During a programming step, the first coded address shown in FIG. 6 will have a logic 1 at address line $A_8$. During this first address, except when READ I/O is performed, data on line $D_0$-$D_7$ is not employed by module 100. During this first address, address lines $A_0$-$A_{11}$ are directed to the data transfer devices 110, 112. The logic is passed through and inverted by these devices, as shown by the standard circles at the input side thereof. This applies the addresses to the input sides of write latches 120, 122, 124. Write latches are standard processing components each of which has a transfer or latching terminal TL. A logic 1 on this terminal allows logic transfer and inversion. A logic 0 latches the inverted form of logic from one side to the other until a logic 1 releases the latches for transfer. During the first address, these latches are at first in the transfer mode with a logic 1 on terminals TL. Thus, the logic on address lines $\overline{A_0}$-$\overline{A_{11}}$ will appear at output side of module 100 at lines $\overline{A_0}$-$\overline{A_{11}}$. The logic on line $A_8$ is applied by line 130 to the D input terminal of a mode select bi-stable device, which is illustrated as a D type flip-flop 132. This flip-flop has a clock terminal CK controlled by I/O WRITE line 134, a reset terminal $\overline{R}$ connected to $\overline{RESET}$ line 136 and a $\overline{Q}$ terminal connected to both the output programming terminal corresponding to the line $A_{15}$ at module 40 and to VERIFY line 138. At a reset of controller A, $\overline{RESET}$ line 136 shifts to a logic 0 to reset flip-flop 132. When the system A is actuated and the various chassis locations, such as location I, are energized, logic 0 appears in the $\overline{CE}$ directed to inverter 140. This controls one input of NAND gate 142 by line 144. Line 144 also controls one input of AND gate 150. During the first address, gate 142, gate 150, gate 180 and gate 184 together decode whether or not the first address is an I/O READ cycle to read from module 100 or an I/O WRITE cycle to write into set module 100 to the PROGRAM or VERIFY mode. This selection process is controlled by the logic on the DBINP and R/$\overline{W}$ lines from CPU 10 or Direct Access Module 20. A logic 1 on the DBINP with the first address indicates a reading function (I/O READ) with gate 180 to be explained later. A logic 0 in the R/$\overline{W}$ line indicates a writing function (I/O WRITE). Both of these I/O functions take place during the first, or I/O address in the dual sequential address concept, as schematically illustrated in FIG. 6. The chassis enable line $\overline{CE}$ enables both gates 142 and 150 by line 144 for function during the initial I/O address. Assuming that lines $A_0$-$A_3$ have addressed the chassis location I, into which module 100 is located, exclusive OR gates 160-166 provide a corresponding signal with the hardwire motherboard logic at input terminals 1, 2, 4 and 8. These hardwired logic signals are at the motherboard of system A to identify the location of the memory being programmed and are used for subsequent addressing of the programmed module 40 in this location. In this instance, location I. Thus, when module 100 is in the proper location, an I/O decoder or AND gate 168 has a logic 1 output in output line 170. This line is also connected as inputs for gates 142 and 150. Consequently, both inputs to gate 142 are at a logic 1 during the I/O address. This produces a logic 0 in line 172 forming one input to NOR gate 180. The other input to gate 180 is the $\overline{DBINP}$ line. This line is at a logic 1 during a write or programming address as shown in FIG. 3. Thus, irrespective of the condition of gate 142, a logic 0 is maintained at output line 182 of gate 180 during the I/O WRITE function now being described. This inhibits NAND gate 184 which is the I/O READ gate. The output 186 of this gate remains at a logic 1 when the module 100 is to be shifted into a selected programming mode. As mentioned before, a logic 0 is a true condition in the data lines. The logic 1 on line 186 is directed to data line $\overline{D_7}$. The logic of data line $\overline{D_7}$ is read during an I/O READ cycle which will be explained later.

Since the first address is to be used for programming, the system A shifts line R/$\overline{W}$ to a logic 1 reading condition. This combines with the logic 1 in the inactive $\overline{DBINP}$ line to produce a logic 1 at all inputs of I/O WRITE gate 150. This produces a logic 1 in I/O WRITE line 134 when the first address indicates that a programming step is to be performed during the second, or memory address. A logic 1 in line 134 clocks flip-flop 132 to shift the condition of address line $A_8$ into the Q terminal. Thus, since a programming step is to be performed, a logic 1 appears in address line $A_8$. This shifts a logic 0 to the $\overline{Q}$ terminal or line 138. At the same time, the Q terminal applies a logic 1 to data control line 190. Consequently, when a WRITE I/O command is given with the I/O address, the condition of address line $A_8$ is clocked into data control line 190. The inverted condition of line $A_8$ is clocked into line 138. Line 190 is directed to the data gates or transfer devices 200, 202, shown in FIG. 8C. This logic 1 shifts gates 200, 202 into the ON condition. This allows transfer of information or data from the left side of the gates or transfer devices to the right side, which is connected to the data terminals or lines $\overline{D_0}$-$\overline{D_7}$. Thus, devices 200, 202 are actuated for transfer of data from the input side at the left of module 100 to the output side at the right of module 100 in a manner which will be apparent during discussion on the programming function.

A logic 0 in line 138 is applied to NOR gate 210 which will be explained later for use in controlling latches 120, 122 and 124. As an initial comment, the logic 0 in line 138 provides a logic 0 at the TL terminals to latch data at the output of latches 120, 122, and 124. Module 100 is now in condition to accept the second or memory address during which the address of the selected module (or module location) and particular location in a memory unit on module 40 is to be directed to module 100.

During the second or memory address, the conditions of the DBINP line and R/$\overline{W}$ lines indicates whether or not the address is a MEMORY READ (verify) or a MEMORY WRITE (PROGRAM). In the illustrated cycle, memory module 40 is to be programmed. Thus, the R/$\overline{W}$ line shifts to a logic 0, as shown in FIG. 3. At the same time, the module (location I) and PROM address of module 40 appears upon lines $A_0$-$A_{15}$. Address lines $A_{12}$-$A_{15}$ control a network including EXCLUSIVE OR gates 220-226, shown in FIG. 8B. The output of these gates controls AND gate 228 having an output line 230. During either a MEMORY READ or MEMORY WRITE cycle, a logic 1 appears in line 230 during the memory address. This line is a logic 0 during the I/O address because of proper coding of lines $A_{12}$-$A_{15}$ for only memory locations (i.e. modules). Line 230 controls MEMORY READ gate 240, which is a NAND gate, and MEMORY WRITE gate 242, which is an AND gate. During the I/O address, these gates are latched into an inoperative condition by line 230. Gates 240, 242 are unlatched by a proper memory module address being directed to module 100, which is the location that will be assumed later by module 40 during operation of system A. The logic 1 enabling condition of line 230 produces a logic 1 at the input of inverter 252, shown in FIG. 8A, during the memory address. This enables READY control 50 for a purpose to be described later. In the memory address, when a MEMORY WRITE cycle is commanded by the R/$\overline{W}$ line, data to be inserted into the selected byte memory location of a PROM unit on module 40 appears on lines $D_0$-$D_7$ at the $\overline{D_0}$-$\overline{D_7}$ input terminals of module 100. In the present instance, there is to be a MEMORY WRITE condition. Thus, the DBINP line stays in the normal logic 0 state. This produces a logic 1 at the $\overline{DBINP}$ input of MEMORY WRITE gate 242. The third input to gate 242 is the inverted R/$\overline{W}$ line 243. Thus, when this line goes to a logic 0 as shown in FIG. 3, a logic 1 appears at the third input to gate 242. At the same time, line 260 or the $\overline{DBINP}$ line is inverted by inverter 262 to produce a logic 0 at the DBINP input of MEMORY READ gate 240. Thus, this gate is disabled and a logic 1 appears in line 270. As shown in FIG. 8C, a logic 1 in line 270 disables data transfer devices 280, 282 connected to the input data terminals $\overline{D_0}$-$\overline{D_7}$ of module 100. Thus, data through these devices can travel only in the direction indicated in the upper arrows of these devices. Data can not be transferred from right to the left through these gates as long as the gates or transfer devices are disabled by a logic 1 in line 270. Thus, when the MEMORY READ gate 240 is disabled, data can be transferred through devices 280, 282 only as shown by the upper arrows. When all inputs to MEMORY WRITE gate 242 are a logic 1, as indicated, a logic 1 appears in the MEMORY WRITE line 290. This allows module 100 to perform the programming function in a manner hereinafter described.

A logic 1 in MEMORY WRITE line 290 is directed to data latches 300, 302. Thus, at the R/$\overline{W}$ pulse, latches 300, 302 are actuated. This latches the data on the $\overline{D_0}$-$\overline{D_7}$ lines to the output of these latches for transfer through devices 200, 202 to the output side of module 100 in terminals $\overline{D_0}$-$\overline{D_7}$. Thus, the data to be programmed into a memory location is latched to the output side of module 100 in lines $\overline{D_0}$-$\overline{D_7}$. The logic 1 in line 290 combines with the logic 0 in line 138 at NOR gate 210 to produce a logic 0 in line 292. Line 294 is thus at a logic 1 because of the intermediate inverter 296. This allows transfer of address logic through latches 120, 122 and 124 so that the data on address lines $A_0$-$A_{11}$ during the memory address appears at the output of the latches. This forms the address on output terminals $\overline{A_0}$-$\overline{A_{11}}$ of module 100, as shown in FIG. 8A. When the R/$\overline{W}$ line shifts back to a logic 1, line 243 shifts to a logic 0. This disables MEMORY WRITE gate 242. Thus, a logic 0 appears in both lines 138 and 290 at gate 210. This produces a continuous logic 0 in line 294 and latches the memory address on lines $\overline{A_0}$-$\overline{A_{11}}$ at the output terminals $\overline{A_0}$-$\overline{A_{11}}$ of module 100. Thus, as so far described, the data on lines $\overline{D_0}$-$\overline{D_7}$ and the address on lines $\overline{A_0}$-$\overline{A_{11}}$ are latched to the output of module 100.

The logic on address lines $A_9$-$A_{11}$ is latched at the input of a memory chip decoder 310 on module 100. This decoder is enabled by a logic 0 appearing in line 312 during a programming pulse to be described later. A logic 1 on line 290 also starts a two stage one shot or bi-stable multivibrator 320 having a clocking terminal B at the upper stage I. A pulse in line 290, and its relationship to the one shot pulses and the R/$\overline{W}$ pulse is illustrated in FIG. 9. A logic 1 at terminal B creates a logic 1 in Q line 322 in the first stage I. This is also shown in FIG. 9. This pulse remains a logic 1 for a predetermined time to allow the circuit so far described to be settled and the data and addresses to be latched into the proper output terminal position. The second stage II of one shot 320 then produces a programming pulse in line 324, as shown in FIG. 9. This programming pulse appears inverted at $\overline{Q}$ line 312. Thus, during the programming pulse of stage II, line 324 is at a logic 1 and line 312 is at a logic 0 enabling decoder 310. This decoder is enabled during the programming pulse, which is illustrated as 1.0 ms in length. During the programming pulse, flip-flop 132 remains in the selected condition. At the end of the programming pulse, both stages I and II are at a logic 0. During programming, line $A_{15}$, which is the program enabling line, is at a logic 0. As will be explained later, when the memory is being read, line $A_{15}$ is a logic 1. The purpose of this will be explained in connection with the circuitry used in module 40, as shown in FIG. 10.

During the programming pulse, a logic 0 appears in line 312 and at the input of I/O READ gate 184. As previously described gate 184 is enabled by a logic 1 in line 182 during an I/O READ cycle of module 100. Gate 184 reads the condition of the programming pulse by placing a logic 1 on line $\overline{D_7}$ when the programming pulse exists. When decoder 310 is enabled by line 312, during the programming pulse, lines $A_9$–$A_{11}$ are decoded and actuate one of eight lines CP0–CP7. These are the program voltage terminals of module 100. Each of these terminals is one of the eight chips on module 40 in a manner shown in FIG. 10. Each of these programmable terminals includes a voltage supply circuit 330 having a voltage input of about 27 volts which is applied to the CP0–CP7 terminal actuated through one of the inverters 331. Pull up resistors 333 are provided for the outputs of decoder 310. This 27 volt voltage supply is substantially greater than the lower level logic voltage used by system A and is provided by a module power supply 332, shown in FIG. 8C. This power supply is mounted directly on module 100 and is an integral part thereof. This power supply is driven by the standard −5 volt and +12 volt low order logic and process voltages of system A. Consequently, supply 332 produces, on module 100, an increased higher voltage which is substantially higher than the logic voltage and which is necessary for programming the chips or units on module 40. By providing the power supply on module 100 itself, there is no possibility of programming or changing the data in module 40 without intentionally doing so by use of a module 100. As so far described, during programming cycles, a programming voltage is provided on one of the program voltage or programming terminals CP0–CP7 and the address bits on lines $\overline{A_0}$–$\overline{A_{11}}$ are latched and transmitted to module 40. Data on lines $\overline{D_0}$–$\overline{D_7}$ is also latched and transmitted through devices 200, 202. Lines $\overline{A_{12}}$, $\overline{A_{13}}$ and $\overline{A_{14}}$, are not transmitted through module 100. They are fictitiously created as a grounded signal by circuit 334, shown in FIG. 8C. In like manner, the logic on hard-wired terminals 1, 2 4 and 8 is not transmitted through module 100. They are fictitiously connected to create a ground signal. This fictitious logic is a logic 0. The use of this fictitious logic for use in module 40 will be considered when describing the operation of the memory module. Fictitious data and addresses are used to guarantee that the module 40 plugged into module 100 will be active for reading or writing to the memory units.

A programming pulse in line 312 controls an interrupt flip-flop shown in FIG. 8C. This flip-flop is clocked upon the positive transition at the end of a programming pulse. Thus, a logic 1 appears in $\overline{Q}$ line 342 at the end of a program pulse. This is inverted by inverter 344. Thus, when a programming pulse terminates, flip-flop 340 sets the interrupt line $\overline{INT7}$ to interrupt processing by system A. This interrupt is processed by the interrupt circuitry of system A to perform any subroutine which is to be performed after a programming cycle. This could be used to verify that the proper programming has taken place by processing a MEMORY READ cycle. The subroutine could indicate that the next program step can now be performed. This circuit does not form a part of the invention but is used in conjunction with system A in the preferred embodiment of module 100 and is illustrated for that purpose. Flip-flop 340 is reset to a logic 1 in line 182 or in line 290. Thus, a subsequent I/O coded address will reset flip-flop 340 by line 182. In a like manner, a logic 1 in MEMORY WRITE line 290 will reset the interrupt flop-flop. Thus, flip-flop 340 is reset during a subsequent I/O address or in a subsequent programming sequence. Switch SW1-5 can be used to bypass this interrupt operation.

During the memory or second address, line 230 shifts to a logic 1. This produces a logic 0 at the input of the READY control 250, as previously described. Thus, this circuit is operative during the memory or second address. The Q terminal 324 of dual one shot device 320 is at a logic 1 during the programming pulse. This is inverted by inverter 350 to produce a logic 0 in line 352. If switch SW1-6, shown in FIG. 8A, is closed, this directs a logic 0 to the READY line of a programmable controller. Thus, as long as there is a program pulse, the microprocessor is waiting (WAIT) in response to a logic 0 in the READY line. When a programming pulse disappears, the READY line shifts to a logic 1. This releases the microprocessor from the programmable controller for subsequent operation. The programming requires a time exceeded by the 1.0 ms programming pulse. In some units, 500 ns is sufficient. In that instance, control 250 is used. Switch SW1-6 is opened and the READY control circuit 250 is not bypassed by line 352. This situation operates somewhat in a standard manner to provide a time delay of about 500 ns between memory programming steps of the microprocessor. At first, the microprocessor starts a cycle and indicates that it is not waiting. Thus, a logic 1 appears in the $\overline{WAIT}$ line. In the dashed line sequence shown in control 250, this produces a logic 0 in the READY line. When the microprocessor receives the inverted READY logic, it then shifts into the WAIT state. This produces a logic 0 in the $\overline{WAIT}$ line to then produce a logic 0 in the READY line. This then tells the microprocessor to proceed. Thus, by using switch SW1-6 the module 100 can produce a 500 ns delay or a delay equal to the programming pulse length of 1.0 ms.

This explains the operation of module 100 to program a single location in the memory module 40, shown in FIG. 10. This module is not extremely complex. The PROM chips 400-0 to 400-7 each receive logic from lines $A_0$–$A_8$. Line $A_9$ is not connected to the chip in the illustrated embodiment. Each one of these chips or units receives a program voltage on one of the program lines CP0–CP7. The data lines $\overline{D_0}$–$\overline{D_7}$ are multiplexed to the eight memory units, which are standard type of the ultraviolet light erasable PROM memory chips. The chips are programmed by approximately 25–27 volts at the programming terminals PRG. Thus, when module 100 creates a programming voltage in one of the lines CP0–CP7 for a time determined by the programming pulse duration, the module location addressed by lines $A_0$–$A_8$ accepts and captures the logic on lines $D_0$–$D_7$. During the programming cycle, line $A_{15}$ is a logic 0. Hardwire terminal 8 is also at a logic 0, as shown in circuit 334. Thus, decoding circuit 410 including EXCLUSIVE OR gates 420, 422, 424 and 426 does not detect an OR condition at gate 420. Line $\overline{A_{15}}$ is a logic 1 and the output of inverter 412 is a logic 1. This produces a logic 0 at the input of NAND gate 430 and a logic 1 in output 432 of this gate. Thus, decoder 440 is inoperative during the programming function. As will be explained later, during the MEMORY READ cycle, $A_{15}$ is at a logic 1. This provides coincidence in circuit 410 to produce a logic 0 in line 432. This enables decoder 440 to select one of the eight memory units 400-0 to 400-7 for directing output data on lines $\overline{D_0}$-$\overline{D_7}$ in accordance with the address on lines $A_0$-$A_8$. Module 40 includes standard transfer devices 450, 452, 454 which invert the logic on lines $\overline{A_0}$-$\overline{A_{14}}$ and $A_{15}$. The connectors, shown as 460, 462, may be used to provide simultaneous operations of pairs of the memory chips or units. In the illustrated position, the terminal $A_9$ of the module units is inactive. $A_0$ is used in the decoder 440 for selecting one of eight units 400-0 to 400-7 on module 40.

The above description of the preferred embodiment of the invention shown in FIG. 8 with respect to the programming cycle clearly illustrates its function during other types of cycles. However, some of these will be reviewed briefly for illustrative purposes only.

VERIFY MODE

If the I/O or first address shown in FIG. 6 is for verification of the data in a particular memory location, a logic 0 appears in line $A_8$ on line 130 at the D terminal of flip-flop 132. During this I/O address, gate 150 is actuated since there is to be an I/O WRITE command for writing information into module 100. This clocks flip-flop 132 to produce a logic 0 in line 190. This turns off data gates 200, 202. Thus, latches 300, 302 are inoperative in the circuit shown in FIG. 8C. At the same time, line $A_{15}$, which is the program control line, shifts to a logic 1. This produces coincidence at gate 420 of circuit 410 shown in FIG. 10. Thus, decoder 440 is enabled. At the same time, a logic 1 appears in line 138. This produces a logic 0 in line 292 and a logic 1 in line 294. Thus, the write latches 120, 122, 124 are in the logic 1 data transfer condition. This condition remains during the memory address and data is transferred from the input to the output of latches 120-124. Thus, the subsequent memory address code on lines $A_0$-$A_{11}$ is transferred to module 40 and into units 450, 452 and 454. This addresses a location for one of the units 400-0 to 400-7. Since decoder 440 is enabled, a certain one of the memory chips or units 400-0 to 400-7 is enabled according to the logic on lines $A_9$-$A_{11}$. This transfers the logic from the addressed locations of the enabled memory unit to the $\overline{D_0}$-$\overline{D_7}$ lines. Referring now to FIG. 8C, the data on the $\overline{D_0}$-$\overline{D_7}$ lines is transferred around transfer devices 200, 202 into the right hand side of transfer devices 280, 282. During a MEMORY READ cycle, there is a DBINP pulse with the memory address. Thus, ultimately a logic 1 appears at the two inputs of gate 240. This produces a logic 0 at line 270 which transfers the data from the right hand side of transfer devices 280, 282 to the left hand side of these devices. Thus, the data at a selected address is verified by the information applied onto the $\overline{D_0}$-$\overline{D_7}$ data lines at the left hand side of module 100. During a DBINP pulse, these lines float; therefore, they may be read to indicate the data stored at selected memory locations in module 40.

To read the condition of module 100, the $\overline{DBINP}$ line shifts to a logic 0 during an I/O address. This produces a logic 1 at the output of gate 180. Thus, gate 184 is enabled to read the condition of line 312. If a programming pulse is being performed, a logic 1 appears in line 186 and is transferred to data line $\overline{D_7}$. Thus, a logic 1 in this line may be read to indicate there is a programming pulse in existence and taking place on module 100. Thus, module 100 may be read by the condition on date line $\overline{D_7}$.

The above description illustrates the operating aspects of the preferred embodiment of the present invention. Certain modifications could be made without departing from the intended spirit and scope of the invention as defined in the appended claims.

Having thus defined the invention, it is claimed:

1. A programming module for programming a number of programmable read only memory units secured onto a single memory module for use at a selected location of several locations in a programmable controller using a microprocessor operated on a given logic voltage level and having output address lines, and input/output bi-directional data lines and having means for creating a read signal on a read line and a write signal on a write line, said units being programmable by data at data terminals on said memory units and at locations determined by an address on address terminals of said memory units only when receiving a program voltage at a programming terminal, said programming module comprising: an input side with terminals temporarily connectable with said address lines, said data lines, said read line and said write line during programming of said units; an output side having address terminals, program voltage terminals and data terminals for connection with said single memory module during programming of said units; means for creating a program initiation signal upon receipt of a command signal on a selected one of said address lines; latch means responsive to said initiation signal for latching data on said data terminals and an address in said address terminals; power means supported on said programming module for creating said program voltage, said program voltage being substantially higher than said given logic voltage level; decoding means for directing said program voltage to a selected one of said program voltage terminals, means for connecting said data terminals of said module to said data terminals of said units; means for connecting said address terminals of said module to said address terminals of said units; and, means for connecting each of said program voltage terminals to a programming terminal of one of said memory units.

2. A programming module as defined in claim 1 including a one-shot device actuated by said initiation signal for creating a delayed, prolonged programming pulse and means for actuating decoding means during said delayed programming pulse.

3. A programming module for programming a number of read only memory units secured onto a single memory module for use at a selected location of several locations in a programmable controller using a microprocessor operated on a given logic voltage level and having output address lines and input/output bi-directional data lines and having means for creating a read signal on a read line and a write signal on a write line, said units being programmable by data at data terminals on said memory units and at locations determined by an address code on address terminals of said units only when receiving a program voltage at a programming terminal and means for creating successive first and second multi-bit address codes on said address lines and means for providing known binary data on said data lines during said second address code, said programming module comprising: an input side with terminals temporarily connectable with said address lines, said data lines, said read line and said write line during programming of said units; an output side having address terminals, program voltage terminals and data terminals for connection with said single memory module during programming of said units; select means for setting said programming module into a programming mode when said first address code has selected logic directed to at least one of said address lines; means responsive to said setting of said selected means in a programming mode and a write signal during said second address code for latching said second address code on said address terminals at the output side of said module; means responsive to said setting of said select means in said programming mode for directing data between data latch means and said output side data terminals; means responsive to a write signal during said second address code for latching said provided data into said data latch means; decoding means responsive to at least two bits of said second address code for applying a program voltage to one of said program voltage terminals; means for connecting said data terminals of said modules to said data terminals of said units; means for connecting said address terminals of said modules to said address terminals of said units; and, means for connecting each of said program voltage terminals to a programming terminal of one of said memory units.

4. A programming module as defined in claim 3 including power means on said programming module for creating said program voltage at a voltage level substantially higher than said given logic voltage level.

5. A programming module as defined in claim 3 including means for applying said applied data from said data terminals at said output side of said module to said bi-directional data lines after said second address code.

6. A programming module as defined in claim 3 including means for creating a programming pulse in response to a write signal during said second address code and means for energizing said decoding means for a time controlled by said programming pulse.

7. A programming module for programming a number of programmable read only memory units secured onto a single memory module for use at a selected location of several locations in a programmable controller using a microprocessor operated on a given logic voltage level and having output address lines and input/output bi-directional data lines and having means for creating a read signal in a read line and a write signal in a write line, and means for creating successive first and second multi-bit address codes on said address lines and means for providing data on said known data lines during said second address code, said programming module comprising: an input side with terminals temporarily connectable with said address lines during programming of said units, said data lines, said read line and said write line; an output side having address terminals, and data terminals for temporary connection with terminals on said single memory module during programming of said units; select means for setting said programming module into a programming mode when said first address code has selected logic directed to at least one of said address lines; means responsive to said setting of said select means in said programming mode and a write signal during said second address code for latching said second address code in said address terminals at said output side of said module; means responsive to a write signal during said second address code for latching said known data into said data terminals at the output side of said module; means for creating a programming pulse during said second coded address and in response to a write signal; means responsive to said programming pulse for directing said latched second address code and latched known data to said address and data terminals at said output side of said module; means for creating a program enable signal to one of said memory units in response to said programming pulse; and means for preventing subsequent addresses during said programming pulse.

8. A programming module as defined in claim 7 including means for latching one of said data lines to a given logic after a programming pulse and responsive to a read signal in a successive first address code.

9. A programming module for programming a number of programmable read only memory units secured onto a single memory module for use at a selected location of several locations in a programmable controller using a microprocessor operated on a given voltage level and having output address lines and input/output bi-directional data lines, each of said units being programmable only when a voltage of a selected level is applied to said unit, said programming module comprising: an input side with terminals temporarily connectable with said address lines and said data lines, an output side having address terminals, program voltage terminals and data terminals for temporary connection with said single memory module, said program voltage terminals each being used to program one of said units; means for decoding at least some of said address lines to produce a program voltage on one of said program voltage terminals; a converter on said programming module for converting said given voltage level to program voltage of said selected voltage level; means for directing said program voltage to said one of said program voltage terminals; means on said module for selectively creating a programming pulse; means for energizing said directing means only when said programming pulse is created; and, means for connecting said voltage terminals to said memory units.

* * * * *